United States Patent
Kim et al.

(10) Patent No.: US 10,965,272 B2
(45) Date of Patent: Mar. 30, 2021

(54) FILTER WITH ANTIRESONANCE FREQUENCY CORRECTION

(71) Applicant: SAMSUNG ELECTRO-MECHANICS CO., LTD., Suwon-si (KR)

(72) Inventors: Hyun Jun Kim, Suwon-si (KR); Yoon Sok Park, Suwon-si (KR); Sung Tae Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 24 days.

(21) Appl. No.: 16/281,959

(22) Filed: Feb. 21, 2019

(65) Prior Publication Data

US 2020/0028488 A1    Jan. 23, 2020

(30) Foreign Application Priority Data

Jul. 17, 2018  (KR) .......................... 10-2018-0082715

(51) Int. Cl.
*H03H 9/54* (2006.01)
*H03H 9/17* (2006.01)
*H03H 9/02* (2006.01)

(52) U.S. Cl.
CPC ........ *H03H 9/542* (2013.01); *H03H 9/02007* (2013.01); *H03H 9/171* (2013.01)

(58) Field of Classification Search
CPC .................... H03H 9/542; H03H 9/02086
See application file for complete search history.

(56) References Cited

U.S. PATENT DOCUMENTS

| | | | |
|---|---|---|---|
| 5,905,418 A | 5/1999 | Ehara et al. | |
| 9,847,769 B2 * | 12/2017 | Khlat | H03H 9/542 |
| 9,882,547 B2 * | 1/2018 | Kando | H03H 9/25 |
| 10,243,537 B2 * | 3/2019 | Khlat | H03H 9/605 |
| 2008/0088393 A1 | 4/2008 | Cathelin et al. | |
| 2008/0204126 A1 | 8/2008 | Wang et al. | |
| 2012/0286900 A1 | 11/2012 | Kadota et al. | |
| 2017/0093370 A1 | 3/2017 | Khlat et al. | |

FOREIGN PATENT DOCUMENTS

| | | |
|---|---|---|
| JP | 2011-71911 A | 4/2011 |
| KR | 1998-070285 A | 10/1998 |
| KR | 2012/0286900 A1 | 8/2012 |

OTHER PUBLICATIONS

Korean Office Action dated Jun. 20, 2019 in corresponding Korean Patent Application No. 10-2018-0082715 (5 pages in English, 5 pages in Korean).

* cited by examiner

*Primary Examiner* — Dean O Takaoka
*Assistant Examiner* — Alan Wong
(74) *Attorney, Agent, or Firm* — NSIP Law (57) ABSTRACT

A filter comprises a series unit comprising a plurality of series resonators, a shunt unit comprising a plurality of shunt resonators, connected between the plurality of series resonators and a ground, and a correction unit comprising an inductor unit connected between both ends of at least one of a set of series resonators of the plurality of series resonators and a set of shunt resonators of the plurality of shunt resonators, and an impedance unit connected between the inductor unit and a ground.

14 Claims, 9 Drawing Sheets

FILTER WITH ANTIRESONANCE FREQUENCY CORRECTION

CROSS-REFERENCE TO RELATED APPLICATION

This application claims the benefit under 35 USC 119(a) of Korean Patent Application No. 10-2018-0082715 filed on Jul. 17, 2018, in the Korean Intellectual Property Office, the entire disclosure of which is incorporated herein by reference for all purposes.

BACKGROUND

1. Field

The present disclosure relates to a filter.

2. Description of Related Art

With the rapid development of mobile communication devices, chemical and biological testing devices, and similar devices, the demand for small and light filters, oscillators, resonant elements, acoustic resonant mass sensors, and similar components, used in such devices, has also increased.

A film bulk acoustic resonator (FBAR) is typically used to implement such small and light filters, oscillators, resonant elements, acoustic resonant mass sensors, and similar components. The FBAR may be mass produced at a minimal cost, and may be implemented to have subminiature sizes. In addition, the FBAR may have a high quality factor (Q) value, a main characteristic of a filter, may be used even in a microwave frequency band, and may particularly implement bands of a personal communications system (PCS) and a digital cordless system (DCS).

Generally, such a FBAR has a structure including a resonating unit which is implemented by sequentially laminating a first electrode, a piezoelectric layer, and a second electrode on a substrate. An operating principle of the FBAR will be described below. First, an electric field is induced in a piezoelectric layer by an electric energy applied to first and second electrodes, and a piezoelectric phenomenon may occur in the piezoelectric layer by the induced electric field, thereby causing the resonating unit to vibrate in a predetermined direction. As a result, a bulk acoustic wave may be generated in the same direction as the direction in which the resonating unit is vibrating, thereby generating resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter In one general aspect, a filter includes a series unit including a plurality of series resonators, a shunt unit including a plurality of shunt resonators, disposed between the plurality of series resonators and a ground; and a correction unit including an inductor unit disposed between both ends of at least one of a set of series resonators of the plurality of series resonators and a set of shunt resonators of the plurality of shunt resonators, and an impedance unit connected between the inductor unit and a ground.

The set of series resonators may be connected in series, and the set of shunt resonators are connected in parallel.

The inductor unit includes at least one inductor disposed in a configuration of three nodes connected in a Y-connection form between both ends of at least one of the set of series resonators and the ground, and the set of shunt resonators and the ground.

The inductor unit includes three inductors disposed at different nodes among the three nodes.

The inductor unit includes two inductors disposed at different nodes among the three nodes.

The two inductors may be coupled to each other, and a mutual inductance of the two inductors may be formed in the remaining nodes of the three nodes.

A coupling coefficient of the two inductors may have a positive sign.

The inductor unit may include at least two inductors connected in series between a first end of one of the set of series resonators and the set of shunt resonators and the impedance unit, and a connection node of the at least two inductors may be connected to a second end of the set of series resonators or the set of shunt resonators.

The at least two inductors may be coupled to each other, and mutual inductance of the at least two inductors may be formed between the connection node of the at least two inductors and the second end of the set of series resonators.

A coupling coefficient of the at least two inductors may have a negative sign.

The impedance unit may include a first capacitor disposed between the inductor unit and the ground.

The impedance unit may further include a first inductor connected in parallel to the first capacitor.

The impedance unit may further include a second capacitor and a second inductor, connected to each other in series, and the second capacitor and the second inductor may be connected in parallel to the first capacitor and the first inductor, connected in parallel.

The correction unit may further include a correction resonator connected in parallel to the impedance unit, and the correction resonator has a same frequency characteristic as one of the series resonators and the shunt resonators.

In a general aspect, a filter includes a series resonator disposed between a signal input terminal and a signal output terminal, a shunt resonator disposed between one end of the series resonator and a ground; and a correction unit including a series correction unit comprising at least two inductors connected in series and mutually coupled between both ends of the series resonator, and a capacitor connected between a connection node of the at least two inductors and a ground, and a shunt correction unit comprising at least two inductors connected in series and mutually coupled between both ends of the shunt resonator, and a capacitor connected between a connection node of the at least two inductors and the ground.

In another general aspect, a filter includes a series resonator connected between a signal input terminal and a signal output terminal, a shunt resonator connected between one end of the series resonator and a ground; and a correction unit including a series correction unit comprising a capacitor connected to a ground and at least two series-connected inductors mutually coupled between one end of the series resonator and the capacitor, and a shunt correction unit comprising at least two series-connected inductors mutually coupled between both ends of the shunt resonator, and a capacitor connected between a connection node of the at least two inductors and the ground.

The set of series resonators may correspond to one or more than one series resonator, and the set of shunt resonators may correspond to one or more than one shunt resonators.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
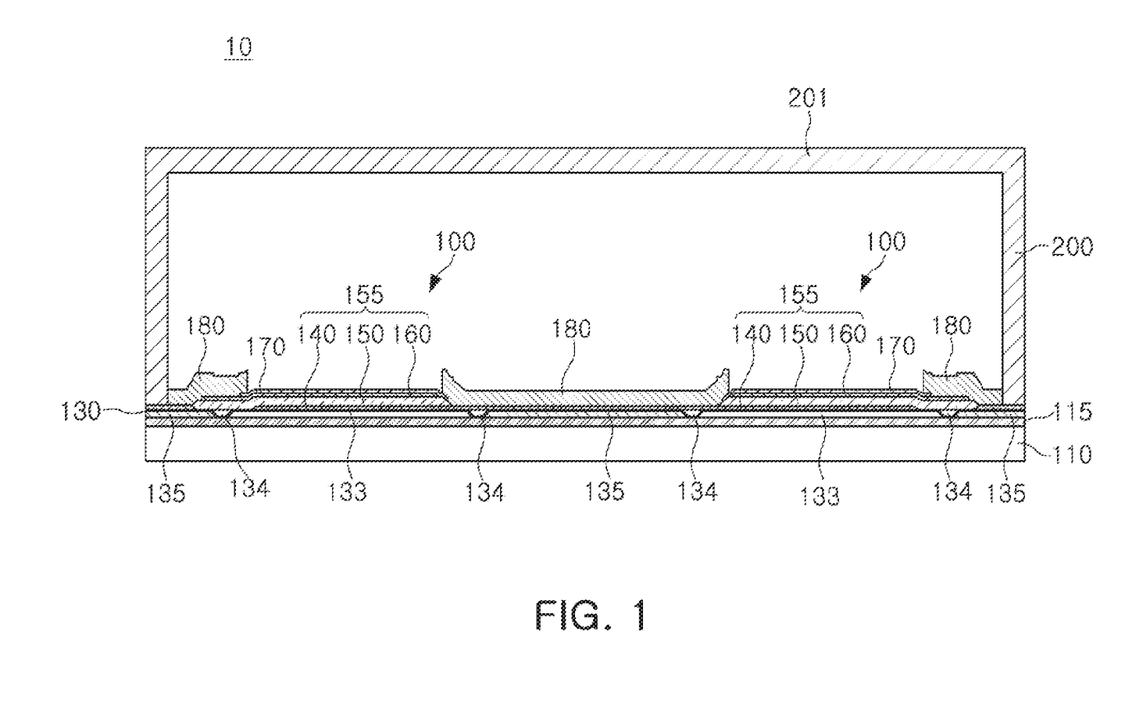
FIG. 1 is a cross-sectional view illustrating an example of a filter.

FIG. 1 is a cross-sectional view illustrating a filter according to an example.

Referring to FIG. 1, a filter 10 according to an example may include at least one volume acoustic resonator 100 and a cap 200. In FIG. 1, the filter 10 is illustrated as including two volume acoustic resonators 100. However, the filter 10 may include one volume acoustic resonator 100, two volume acoustic resonators 100, or three or more volume acoustic resonators 100. The volume acoustic resonator 100 may be a thin film bulk acoustic resonator (FBAR).

The volume acoustic resonator 100 may be constituted by a laminated structure composed of a plurality of films. The laminated structure constituting the volume acoustic resonator 100 may include a substrate 110, an insulating layer 115, an air cavity 133, a support unit 134, an auxiliary support unit 135, and a resonating unit 155 including a first electrode 140, a piezoelectric layer 150, and a second electrode 160, and may further include a protective layer 170 and a metal layer 180.

According to a manufacturing process of the volume acoustic resonator 100 according to an example, a sacrificial layer may be formed on the insulating layer 115, and then a portion of the sacrificial layer may be removed to form a pattern provided with the support unit 134. Here, the auxiliary support unit 135 may be formed by a remaining sacrificial layer. A width of an upper surface of a pattern formed on the sacrificial layer may be wider than a width of a lower surface, and a side surface connecting the upper surface and the lower surface may be inclined. After forming the pattern on the sacrificial layer, a membrane 130 may be formed on the insulating layer 115 exposed externally by the sacrificial layer and the pattern.

After forming the membrane 130, an etch stop material underlying formation of the support unit 134 may be formed to cover the membrane 130. After forming the etch stop material, one surface of the etch stop material may be planarized such that the membrane 130 formed on the upper surface of the sacrificial layer may be exposed externally. In the process of planarizing one surface of the etch stop material, a portion of the etch stop material may be removed, and the support unit 134 may be formed by an etch stop material remaining in the pattern after the portion of the etch stop material is removed. As a result of the process of planarizing the etch stop material, one surface of the support unit 134 and the sacrificial layer may be generally flat. Here, the membrane 130 may function as a stop layer of the planarization process of the etch stop material.

Thereafter, the air cavity 133 may be formed by an etching process in which the sacrificial layer is etched after the first electrode 140, the piezoelectric layer 150, the second electrode 160, and the like are laminated and removed. For example, the sacrificial layer may include polycrystalline silicon (Poly-Si). The air cavity 133 may be located at a lower portion of the resonating unit 155 such that the resonating unit 155 composed of the first electrode 140, the piezoelectric layer 150, and the second electrode 160 may vibrate in a predetermined direction.

The substrate 110 may be composed of a silicon substrate, and the insulating layer 115 may be provided to electrically isolate the resonating unit 155 from the substrate 110. The insulating layer 115 may be formed of at least one of silicon dioxide ($S_iO_2$), silicon nitride ($Si_3N_4$), aluminum oxide ($Al_2O_2$), and aluminum nitride (AlN), but not limited thereto, and may be formed on the substrate 110 by chemical vapor deposition, RF magnetron sputtering (RF Magnetron Sputtering) or evaporation.

An etch stop layer may be additionally formed on the insulating layer 115. The etch stop layer may protect the substrate 110 and the insulating layer 115 from the etching process, and may act as a stereobate for depositing other layers on the etch stop layer.

The air cavity 133 and the support unit 135 may be formed on the insulating layer 115. As described above, the air cavity 133 may be formed by an etching process in which a sacrificial layer is etched and removed, after forming a pattern in which the sacrificial layer is formed on the insulating layer and the support unit 134 is provided on the sacrificial layer, and then the first electrode 140, the piezoelectric layer 150, the second electrode 160 are formed and laminated.

The air cavity 133 may be located at a lower portion of the resonating unit 155 such that the resonating unit 155 composed of the first electrode 140, the piezoelectric layer 150, and the second electrode 160 may vibrate in a predetermined direction. The support unit 134 may be provided on one side of the air cavity 133.

The thickness of the support unit 134 may be the same as the thickness of the air cavity 133, but is not so limited. Thus, the upper surfaces provided by the air cavity 133 and the support unit 134 may be substantially flat. According to an example, the resonating unit 155 may be disposed on a planarized surface from which a step is removed, such that an attenuation characteristic of the volume acoustic resonator may be improved.

A cross-section of the support unit 134 may have a substantially trapezoidal shape. Specifically, the width of the upper surface of the support unit 134 may be wider than the width of the lower surface, a side surface connecting the upper surface and the lower surface may be inclined. The support unit 134 may be formed of a material which is not etched in an etching process to remove the sacrificial layer. For example, the support unit 134 may be formed of the same material as the insulating layer 115, and specifically, the support unit 134 may be formed of one of silicon dioxide ($SiO_2$) and silicon nitride ($Si_3N_4$), or a combination thereof.

According to an example, the side surface of the support unit 134 may be formed to be inclined to prevent an abrupt step from occurring at a boundary between the support unit 134 and the sacrificial layer, and the width of the lower surface of the support unit 134 may be formed to be narrow to prevent an occurrence of a dishing phenomenon. For example, an angle between the lower surface and the side surface of the support unit 134 may be 110° to 160°, and the width of the lower surface of the support unit 134 may be 2 μm to 30 μm.

An auxiliary support unit 135 may be provided outside of the support unit 134. The auxiliary support unit 135 may be formed of the same material as the support unit 134, and may be formed a different material from the support unit 134. For example, when the auxiliary support unit 135 is formed of a different material from the material of the support unit 134, the auxiliary support unit 135 may correspond to one portion of the sacrificial layer formed on the insulating layer 115 which remains after the etching process.

A resonating unit 155 may include the first electrode 140, the piezoelectric layer 150 and the second electrode 160. A common area overlapping in a vertical direction of the first electrode 140, the piezoelectric layer 150, and the second electrode 160 may be located at an upper portion of the air cavity 133. The first electrode 140 and the second electrode 160 may be formed of one of gold (Au), titanium (Ti), tantalum (Ta), molybdenum (Mo), ruthenium (Ru), platinum (Pt), tungsten (W), aluminum (Al), iridium (Ir), and nickel (Ni), or an alloy thereof. The piezoelectric layer 150 is a layer that causes a piezoelectric effect converting electrical energy into mechanical energy in the form of elastic waves. In the piezoelectric layer 150, zinc oxide (ZnO), aluminum nitride (AlN), doped aluminum nitride, lead zirconate titanate, quartz, and similar compounds may be selectively used. In the case of the doped aluminum nitride, it may further include a rare earth metal transition metal, or an alkaline earth metal. For example, the rare earth metal may include at least one of scandium (Sc), erbium (Er), yttrium (Y), and lanthanum (La), and a rare earth content may include 1 to 20 at %. The transition metal may include at least one of hafnium (Hf), titanium (Ti), zirconium (Zr), tantalum (Ta), and niobium (Nb). In addition, an alkaline earth metal may also include magnesium (Mg).

A membrane 130 may be formed of a material which is not able to be easily removed in the process of forming the air cavity 133. For example, when a halide-based etching gas such as fluorine (F), chlorine (Cl), or similar gas is used to remove a unit of the sacrificial layer, to form the cavity 133, the membrane 130 may be formed of a material having a low reactivity with the etching gas. In this example, the membrane 130 may include at least one of silicon dioxide ($S_iO_2$), and silicon nitride ($S_{i3}N_4$). In addition, the membrane 130 may be formed of a dielectric layer containing at least one material of magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($T_iO_2$), and zinc oxide (ZnO), or may be formed of a metal layer containing at least one material of aluminum (Al), nickel (Ni), chrome (Cr), platinum (Pt), gallium (Ga), and hafnium (Hf).

According to an example, a seed layer made of aluminum nitride (AlN) may be formed on the membrane 130. Specifically, the seed layer may be disposed between the membrane 130 and the first electrode 140. The seed layer may be formed using a dielectric or metal having an HCP structure in addition to aluminum nitride (AlN). In the example where the seed layer is formed using metal, the seed layer may be formed with titanium (Ti).

The protective layer 170 may be disposed on the second electrode 160 to prevent the second electrode 160 from being exposed to external conditions. The protective layer 170 may be formed of one insulating material of a silicon oxide series, a silicon nitride series and an aluminum nitride series, and an aluminum oxide series. A metal layer 180 may be formed on the first electrode 140 and the second electrode 160, which are exposed to external conditions.

The resonating unit 155 may be divided into an active area and an inactive area. The active area of the resonating unit 155 is an area which vibrates and resonates in a predetermined direction by a piezoelectric phenomenon generated in the piezoelectric layer 150 when an electric energy such as a radio frequency signal is applied on the first electrode 140 and the second electrode 160, and corresponds to an area in which the first electrode 140, the piezoelectric layer 150, and the second electrode 160 are superimposed in a vertical direction at an upper portion of the air cavity 133. The inactive area of the resonating unit 155 is an area which is not resonated by the piezoelectric phenomenon even though the electric energy is applied to the first electrode 140 and the second electrode 160, and corresponds to an area that is external to the active area.

The resonating unit 155 outputs a radio frequency signal having a specific frequency based on the piezoelectric phenomenon. Specifically, the resonating unit 155 may output the radio frequency signal having a resonance frequency corresponding to a vibration according to the piezoelectric phenomenon of the piezoelectric layer 150.

A cap 200 may be bonded to a laminated structure forming a plurality of volume acoustic resonators 100. The cap 200 may be formed to have a cover shape having an internal space in which a plurality of volume acoustic resonators 100 are accommodated. The cap 200 may be formed in a hexahedron shape having a lower surface opened, and may include an upper portion and a plurality of sides connected to the upper portion. However, the shape of the cap is not limited thereto.

The cap 200 may be formed with an accommodating unit in a center to accommodate the resonating unit 155 of the plurality of volume acoustic resonators 100. The laminated structure may be bonded to a plurality of sides in a bonding area, and the bonding area of the laminated structure may correspond to an edge of the laminated structure. The cap 200 may be bonded to the substrate 110, which is laminated on the substrate 110. In addition, the cap 200 may be bonded to at least one of the protective layer 170, the membrane 130, and the insulating layer 115, the first electrode 140, the piezoelectric layer 150, the second electrode 160, and the metal layer 180.

Figure 2:
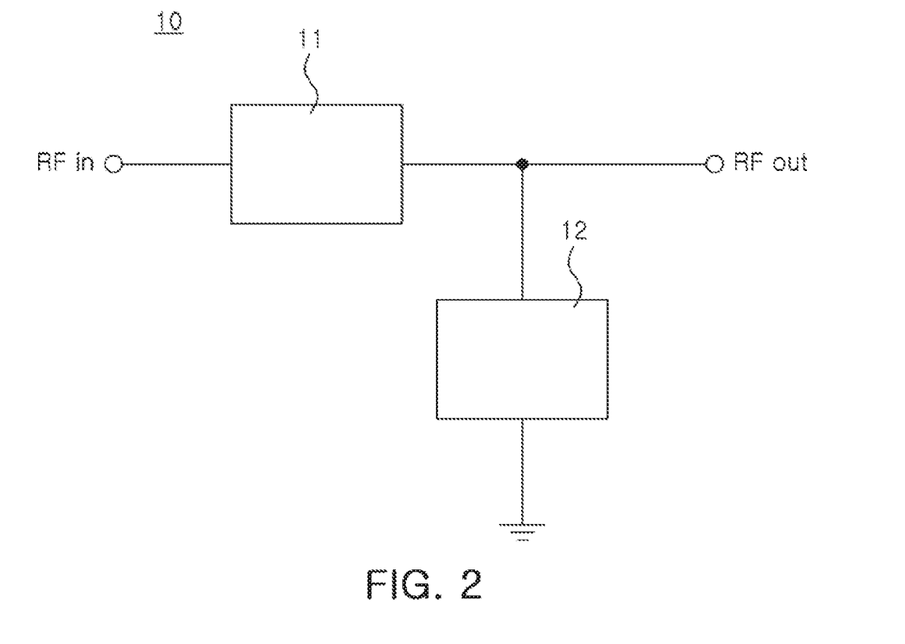
FIG. 2 is an example of a block diagram of a filter.

FIG. 2 is an example of a block diagram of a filter. Referring to FIG. 2, the filter 10 may include at least one series unit 11 and at least one shunt unit 12 disposed between the at least one series unit 11 and a ground. The filter 10, as illustrated in FIG. 2, may be formed of a filter structure of a ladder type, or may be formed of a filter structure of a lattice type.

At least one series unit 11 may be disposed between a signal input terminal ($RF_{in}$) which inputs an input signal, and a signal output terminal ($RF_{out}$) which outputs an output signal, and the shunt unit 12 may be disposed between the series unit 11 and a ground. Each of the at least one series unit 11 and the at least one shunt unit 12 may each have at least one of the volume acoustic resonators illustrated in FIG. 1.

For example, when the series unit 11 includes a plurality of volume acoustic resonators, and the shunt unit 12 includes a plurality of volume acoustic resonators, the plurality of volume acoustic resonators provided in the series unit 11 may be connected in series, and a unit of volume acoustic resonators may be connected in parallel according to an example. In addition, a plurality of volume acoustic resonators provided in the shunt unit 12 may be disposed between one node of the plurality of volume acoustic resonators provided in the series unit 11 and a ground.

Figure 3:
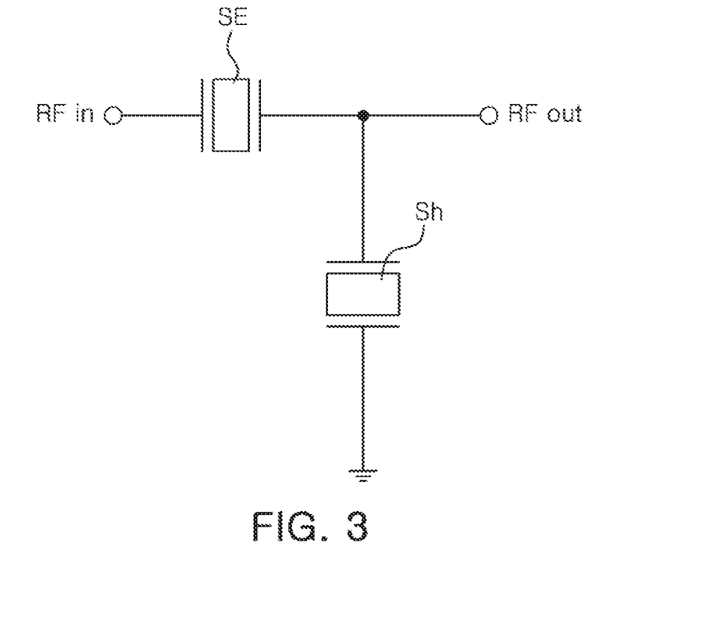
FIG. 3 illustrates an example of a circuit diagram of a filter.
Figure 4:
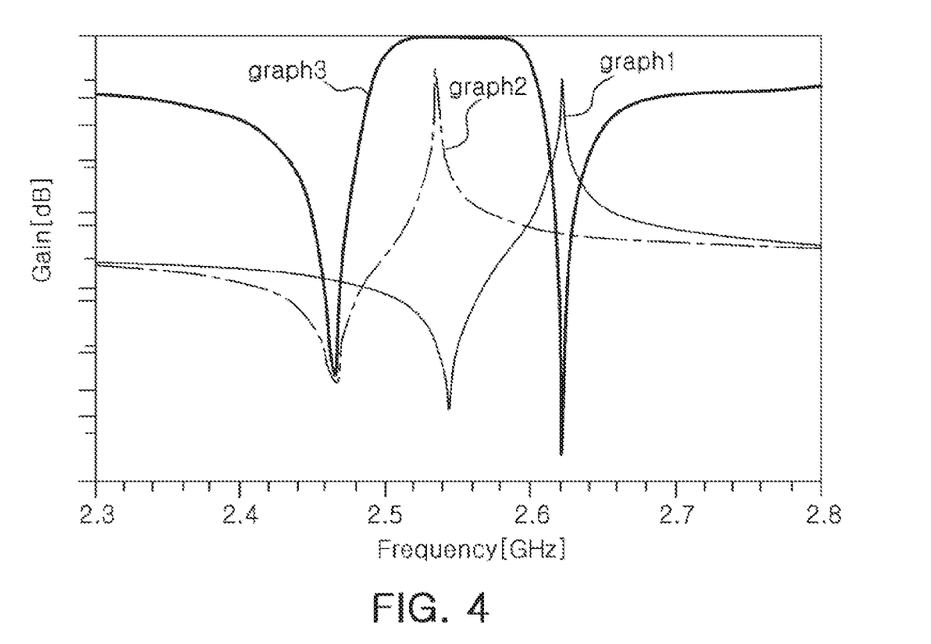
FIG. 4 illustrates an example of a frequency response of the filter of FIG. 3.

FIG. 3 illustrates an exemplary circuit diagram of a filter, and FIG. 4 illustrates a frequency response of the filter of FIG. 3.

Referring to FIG. 3, the filter may include a series resonator (SE) disposed between a signal input terminal ($RF_{in}$) and a signal output terminal ($RF_{out}$), and a shunt resonator (Sh) disposed between the series resonator (SE) and a ground.

Referring to FIG. 4, a first graph (Graph 1) represents a frequency response by the series resonator (SE), and a second graph (Graph 2) represents a frequency response by the shunt resonator (Sh), and a third graph (Graph 3) represents a frequency response by a filter including the series resonator (SE) and the shunt resonator (Sh).

The frequency response by the series resonator (SE) has a resonance frequency (fr_SE) and an antiresonance frequency (fa_SE), and the frequency response by the shunt resonator (Sh) has a resonance frequency (fr_Sh) and an antiresonance frequency (fa_Sh).

Referring to the frequency response of the filter, a bandwidth of the filter may be determined in proportion to an interval between a resonance frequency (fr) and an antiresonance frequency (fa) of the resonator.

In order for the filter to be implemented as a bandwidth pass filter, the resonance frequency (fr_SE) of the series resonator (SE) should be higher than the resonance frequency (fr_Sh) of the shunt resonator (Sh), and the antiresonance frequency (fa_SE) of the series resonator (SE) should be higher than the antiresonance frequency (fa_Sh) of the shunt resonator (Sh). For example, the piezoelectric layer of the shunt resonator (Sh) may be implemented to be thicker than the piezoelectric layer of the series resonator (SE), such that a relationship between the resonance frequency and the antiresonance frequency, as described above, may be set.

On the other hand, a bandwidth and an effective electromechanical coupling coefficient, $Kt^2$ may be defined according to the following equations 1 and 2.

$$\text{Band width} \approx fr - fa \qquad \text{Equation 1}$$

$$Kt^2 = \frac{\pi^2}{4} * \frac{fr - fa}{fa\_SH} * 100 \qquad \text{Equation 2}$$

On the other hand, the bandwidth of the filter may be adjusted, by connecting a passive element to the series resonator (SE) and the shunt resonator (Sh). In particular, to adjust the bandwidth by changing only the antiresonance frequency (fa) in a state in which the resonance frequency (fr) of the resonator is fixed, the passive element may be connected in parallel to the series resonator. For example, when the capacitors are connected in parallel with the series resonator (SE), the antiresonance frequency (fa_SE) may be adjusted to be low. However, when referring to Equation 1, the bandwidth of the filter becomes narrower, it may not be used for the purpose of increasing the bandwidth. As another example, when an inductor is connected in parallel with the series resonator (SE), the antiresonance frequency (fa_SE) of the series resonator (SE) may be adjusted to be high, such that the bandwidth may be widened.

However, when the inductor is connected in parallel with the series resonator (SE), harmonics of the antiresonance frequency may be generated, such that an attenuation characteristic is deteriorated, and an inductor having a sufficiently high inductance may be required to increase the bandwidth, such that a quality factor Q and an insertion loss characteristic may be deteriorated.

Figure 5A:
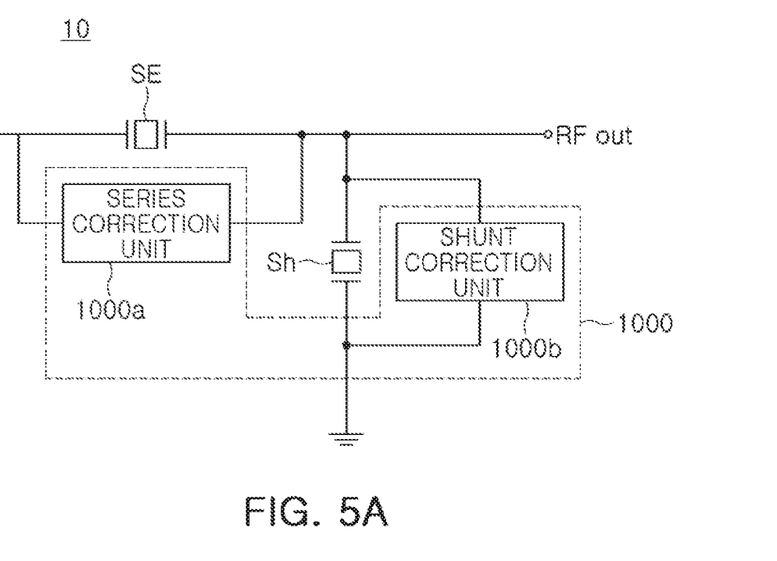
FIG. 5A is an example of a circuit diagram of a filter.

FIG. 5A is a circuit diagram of an example of a filter.

Referring to FIG. 5A, a filter 10 according to an example may include a series resonator (SE) disposed between a signal input terminal ($RF_{in}$) and a signal output terminal ($RF_{out}$), a shunt resonator (Sh) disposed between the series resonator (SE) and a ground, and a correction unit 1000. Each of the series resonator (SE) and the shunt resonator (Sh) corresponds to a configuration included in the series unit 11 and the shunt unit 12 of FIG. 2.

The correction unit 1000 may include at least one of a series correction unit 1000a disposed at both ends of the series resonator (SE) and a shunt correction unit 1000b disposed at both ends of the shunt resonator (Sh). For example, the series correction unit 1000a may be disposed between both ends of the series resonator (SE) and a ground, and the shunt correction unit 1000b may be disposed between both ends of the shunt resonator (Sh) and a ground.

In FIG. 5A, the filter 10 is illustrated as including one series resonator (SE) and one shunt resonator (Sh). However, a plurality of series resonators (SE) and a plurality of shunt resonators (Sh) may be provided. In this example, the series correction unit 1000a may be disposed between both ends of a unit of series resonators (SE) among the plurality of series resonators (SE) connected in series or in parallel, and the shunt correction unit 1000b may be disposed between both ends of a unit of shunt resonators (SE) among the plurality of shunt resonators (Sh) and the ground connected in series or in parallel. More specifically, when the correction unit is applied to the resonators connected in parallel, the correction unit may be disposed in parallel to the resonators connected in parallel, and when the correction unit is applied to the resonators connected in series, the correction unit may be disposed in parallel with nodes at both ends of an entire circuit constituted by the resonators connected in series.

The series correction unit 1000a may adjust the antiresonance frequency (fa_SE) of the series resonator (SE), and the shunt correction unit 1000b may adjust the antiresonance frequency (fa_Sh) of the shunt resonator (Sh).

In FIG. 5A, the correction unit 1000 is illustrated as including both the series correction unit 1000a and the shunt correction unit 1000b. However, according to an example, the correction unit 1000 may include at least one of the series correction unit 1000a, or the shunt correction unit 1000b, or both the series correction unit 1000a and the shunt correction unit 1000b.

Hereinafter, for convenience of explanation, it is assumed that the correction unit 1000 includes only the series correction unit 1000a, and an example will be described in detail. However, the following description may be applied to the shunt correction unit 1000b.

Figure 5B:
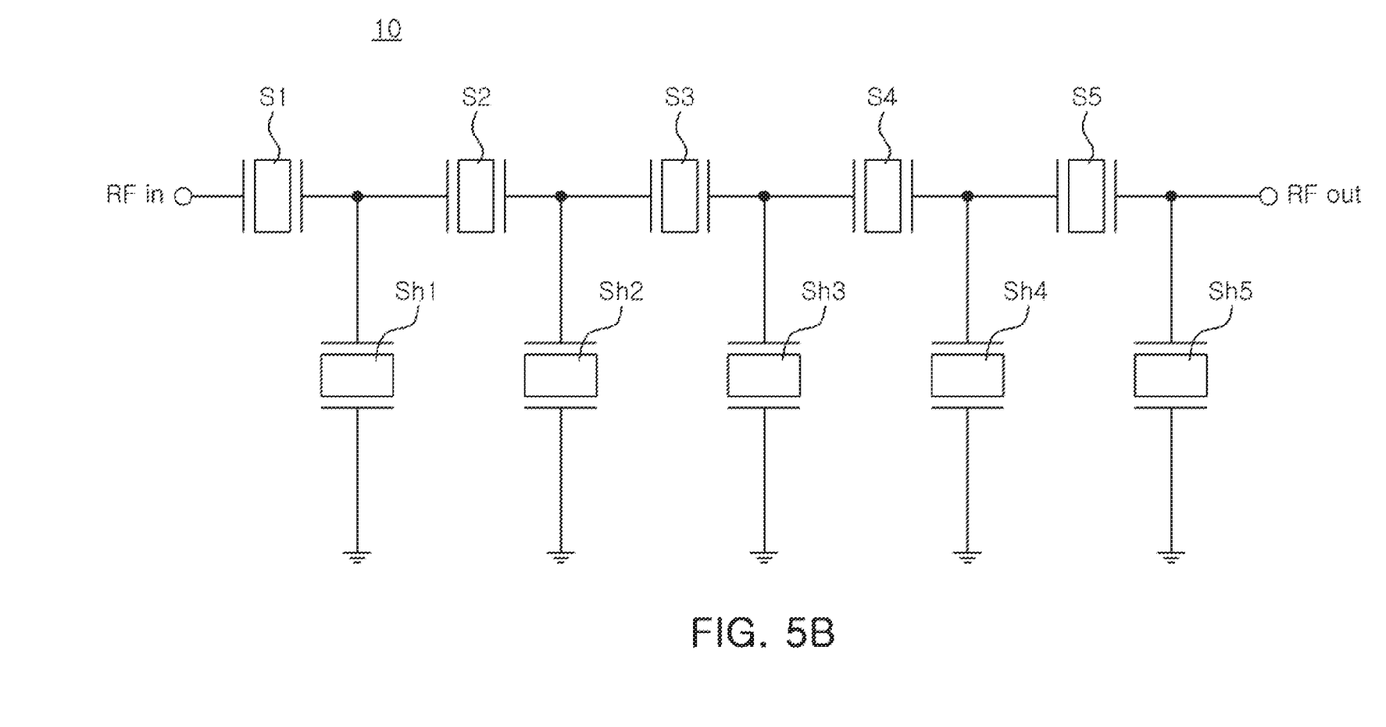
FIG. 5B is another example of a circuit diagram of a filter.

FIG. 5B is a circuit diagram of a filter according to an example.

Referring to FIG. 5B, the filter 10 may include a plurality of series resonators (S1 to S5) and a plurality of shunt resonators (Sh1 to Sh5). The plurality of series resonators (S1 to S5) may be connected in series between the signal input terminal ($RF_{in}$) and the signal output terminal ($RF_{OUT}$). For example, the first series resonator S1, the second series resonator S2, the third series resonator S3, the fourth series resonator S4, and the fifth series resonator S5 may be connected in series.

The plurality of shunt resonators (Sh1 to Sh5) may individually be disposed or connected between the plurality of series resonators S1 to S5 and a ground. For example, each of the plurality of shunt resonators (Sh1 to Sh5) may be disposed between different series resonators (S1 to S5) and a ground.

The first shunt resonator Sh1 may be disposed between a node between the first series resonator S1 and the second series resonator S2 and a ground, the second shunt resonator Sh2 may be disposed between a node between the second series resonator S2 and the third series resonator S3 and a ground, the third shunt resonator Sh3 may be disposed between a node between the third series resonator S3 and the fourth series resonator S4 and a ground, the fourth shunt resonator Sh4 may be disposed between a node between the fourth series resonator S4 and the fifth series resonator S5 and a ground, and the fifth shunt resonator Sh5 may be disposed between a node between the fifth series resonator S5 and the signal output terminal ($RF_{OUT}$) and a ground.

Figure 6:
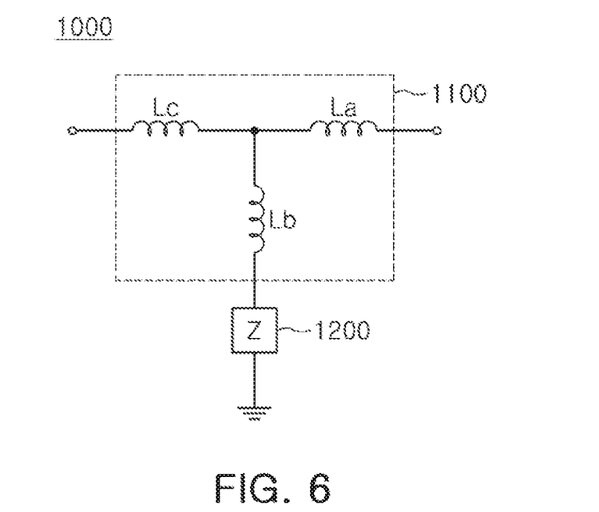
FIG. 6 is an example of a circuit diagram of a correction unit.

FIG. 6 is a circuit diagram of a correction unit according to an example.

Referring to FIG. 6, the correction unit 1000 may include an inductor unit 1100 including a plurality of inductors and an impedance unit 1200 including at least one capacitor.

The inductor unit 1100 may include at least one inductor. At least one inductor may be disposed in a unit of three nodes connected in a Y-connection form between both ends of the series resonator (SE) and the ground.

Referring to FIG. 6, the inductor unit 1100 may include an inductor (La) and an inductor (Lc) disposed at both ends of the series resonator (SE) in series, and an inductor (Lb) disposed at a node between the inductor (La) and the inductor (Lc). In FIG. 6, the inductor unit 1100 is illustrated as including the three inductors La, Lb, and Lc. However, this is only an example, and the inductor unit 1100 may include at least one of the three inductors La, Lb, and Lc or more than the three inductors.

In an example, the inductor unit may be connected between both ends of at least one of a set of series resonators of the plurality of series resonators and a set of shunt resonators of the plurality of shunt resonators. In an example, the set of series resonators may be equal to one series resonator or more than one series resonators. Similarly, the set of shunt resonators may be equal to one or more than one shunt resonators.

Additionally, in FIG. 6, the inductor unit 1100 is illustrated as including the three inductors La, Lb, and Lc. However, this is only an example. The inductor unit 1100 may include two inductors of the three inductors La, Lb, and Lc, and the remaining inductors may be formed by mutual impedance of the two inductors. The impedance unit 1200 may include an impedance Z disposed between the inductor (Lb) and a ground.

Figure 7:
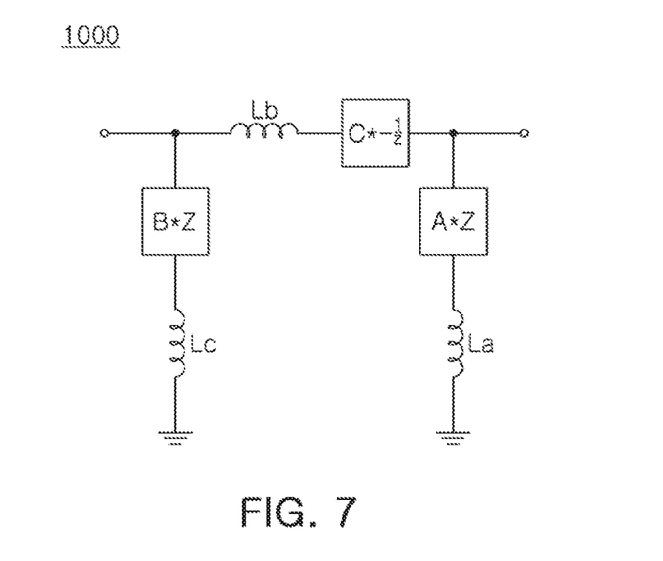
FIG. 7 is an example of a modified circuit diagram of the correction unit of FIG. 6.

FIG. 7 is an example of a modified circuit diagram of a correction unit of FIG. 6.

Referring to FIG. 7, the impedance Z of the impedance unit 1200 of FIG. 6 may be converted into an impedance A*Z, connected in series to the inductor (La) according to Y to D conversion, an impedance C*-1/Z, connected in series to the inductor (Lb), and an impedance B*Z, connected in series to the inductor (Lc).

The total impedance ZA of the inductor La and the impedance A*Z improves the skirt characteristic by forming an additional pole outside the bandwidth in the frequency response of the filter, and the total impedance ZB of the inductor Lb and the impedance C*-1/Z is Series resonator SE to change the antiresonance frequency fa_SE of the series resonator SE and the total impedance Zc of the inductor Lc and the impedance B*Z is connected in parallel to the shunt resonator (Sh), The antiresonance frequency (fa_Sh) of the shunt resonator (Sh) may be changed.

Here, the impedance ZA, the impedance ZB, and the impedance ZC can be determined according to the following equation (3).

$$Z_A = jwLa + \left(1 + \frac{La}{Lb}\right)*Z$$
$$Z_B = jwLc + \left(1 + \frac{Lc}{La}\right)*Z$$
$$Z_C = jwLa + jwLc + \frac{jwLa*jwLc}{Z}$$

Equation 3

Figure 8A:
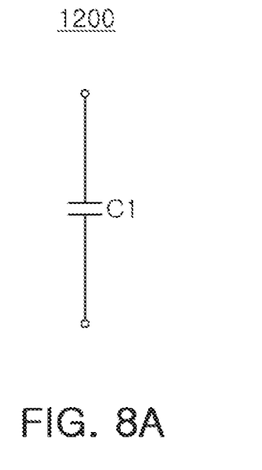
FIGS. 8A, 8B, and 8C are examples of a circuit diagram of an impedance unit.
Figure 8B:
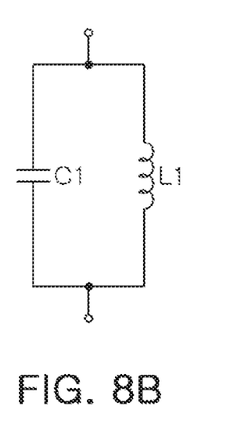
Figure 8C:
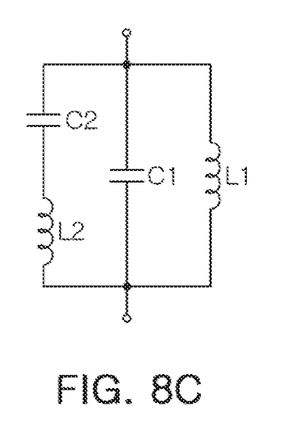

FIGS. 8A, 8B, and 8C are circuit diagrams of an impedance unit according to an example.

Referring to FIG. 8A, the impedance unit 1200 may include a capacitor C1, and referring to FIG. 8B, the impedance unit 1200 may further include an inductor L1, connected in parallel to the capacitor C1 of FIG. 8A. Additionally, referring to FIG. 8C, the impedance unit 1200 may further include a capacitor C2 and a circuit of the inductor L2 connected in parallel with the capacitor C1 and the inductor L1.

The impedance unit 1200 according to an example may include at least one capacitor and one inductor, to change the frequency response of the filter.

Figure 9:
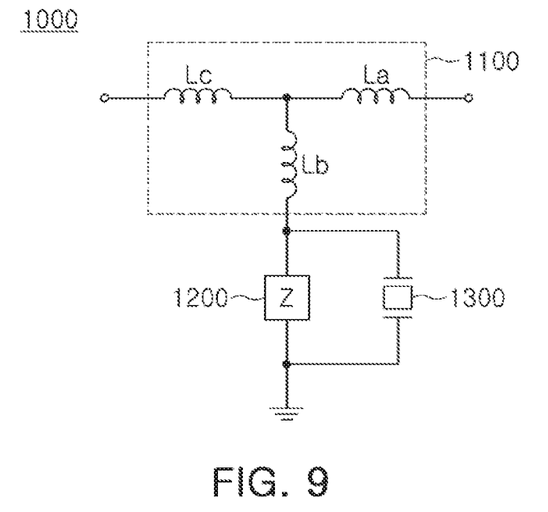
FIG. 9 is another example of a circuit diagram of a correction unit.

FIG. 9 is a circuit diagram of a correction unit according to another example.

Since a correction unit according to an example of FIG. 9 is similar to a correction unit according to an example of FIG. 6, duplicate descriptions will be omitted and differences will be mainly described.

Referring to FIG. 9, a correction unit 1000 may include an inductor unit 1100, an impedance unit 1200, and a correction resonator 1300. The correction resonator 1300 may be connected in parallel to the impedance unit 1200. The correction resonator 1300 may have the same frequency characteristics as one of the series resonator (SE) and the shunt resonator (Sh) of the filter 10. For example, the correction resonator 1300 may have the same resonance frequency and antiresonance frequency as the series resonator (SE), or may have the same resonance frequency and antiresonance frequency as the shunt resonator (Sh).

Figure 10:
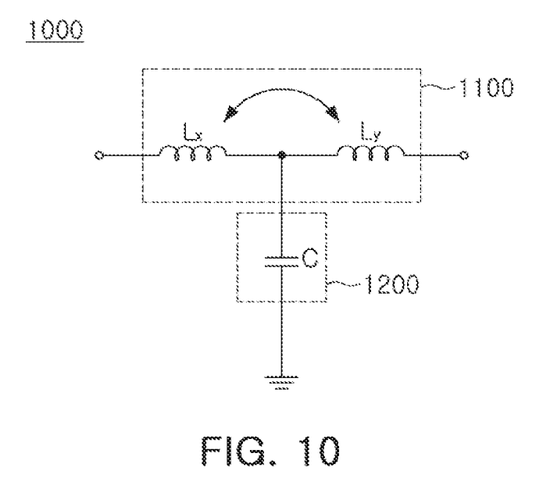
FIG. 10 is another example of a circuit diagram of a correction unit.

FIG. 10 is a circuit diagram of a correction unit according to another example.

Referring to FIG. 10, the inductor unit 1100 may include an inductor Lx and an inductor Ly, disposed at both ends of the series resonator (SE) in series. The impedance unit 1200 may include a capacitor C disposed between a connection node of the inductor Lx and the inductor Ly and the ground. The inductor Lx and the inductor Ly of the inductor unit 1100 may be connected to each other, and a coupling coefficient of the inductor Lx and the inductor Ly may have a positive sign. In other words, the inductor Lx and the inductor Ly may be connected by a direct coupling manner.

Figure 11:
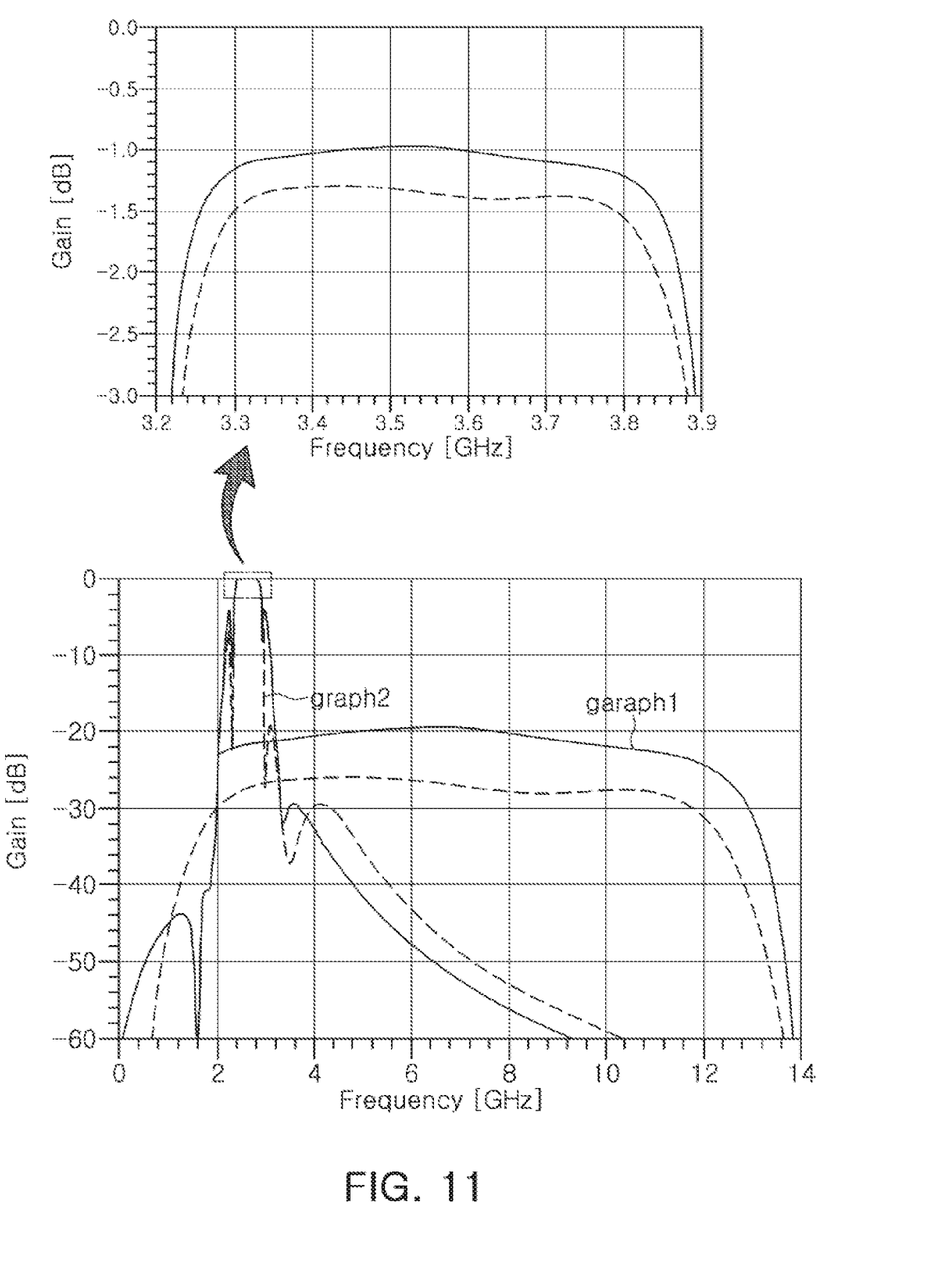
FIG. 11 illustrates an example of a frequency response to which the correction unit of FIG. 10 is applied.

FIG. 11 is a diagram illustrating a frequency response of a filter to which a correction unit according to an example of FIG. 10 is applied.

In FIG. 11, a first graph (graph 1) represents a frequency response of a filter in which the correction unit according to an example of FIG. 10 is applied to the series resonator (SE), and a second graph (graph 2) represents a frequency response of a filter corresponding to a comparison example in which a correction unit is not applied.

Figure 12:
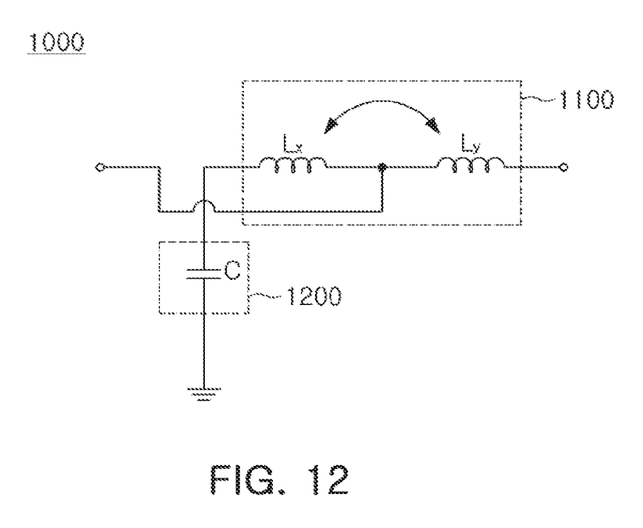
FIG. 12 is a circuit diagram of another example of a correction unit.

It can be seen that the filter according to the example of FIG. 11 has a wider bandwidth and significantly improved insertion loss characteristics, as compared with the filter according to a comparative example, referring to the first graph (graph 1) and the second graph (graph 2) of FIG. 12.

FIG. 12 is a circuit diagram of a correction unit according to another example.

Referring to FIG. 12, the inductor unit 1100 may include the inductor Lx and the inductor Ly disposed at one end of the series resonator (SE) in series. Specifically, the inductor unit 1100 may include the inductor Ly, connected to one end of the series resonator (SE) and the inductor Lx, connected to the inductor Ly. The connection node of the inductor Lx and the inductor Ly may be connected to the other end of the series resonator (SE). The impedance unit 1200 may include the capacitor C disposed between the inductor Lx and the ground. The inductor Lx and the inductor Ly of the inductor unit 1100 may be connected to each other, and the coupling efficiency of the inductor Lx and the inductor Ly may have a negative sign. In other words, the inductor Lx and the inductor Ly may be coupled in an inverse coupling manner.

The above-described various examples of the correction unit may be applied to the series correction unit and the shunt correction unit in the same or different forms. For example, the correction unit of the example of FIG. 10 may be applied to the series correction unit and the shunt correction unit, and as another example, the correction unit of the example of FIG. 13 may be applied to the series correction unit, and the correction unit of the example of FIG. 11 may be applied to the shunt correction unit.

As set forth above, in a filter according to an example, deterioration of an attenuation characteristic, a quality factor Q, and an insertion loss according to antiresonant frequencies generated when an inductor having a sufficiently high inductance is connected to a series resonator to increase a bandwidth, may be prevented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A filter comprising:
    a series unit comprising a plurality of series resonators;
    a shunt unit comprising a plurality of shunt resonators, disposed between the plurality of series resonators and a ground; and
    a correction unit comprising
        an inductor unit disposed between both ends of at least one of a set of series resonators of the plurality of series resonators and a set of shunt resonators of the plurality of shunt resonators, and
        an impedance unit disposed between the inductor unit and a ground,
    wherein the inductor unit comprises at least two inductors connected in series between a first end of one of the set of series resonators and the set of shunt resonators and the impedance unit, and
    wherein a coupling coefficient of the at least two inductors has a negative sign.

2. The filter of claim 1, wherein the set of series resonators are connected in series, and the set of shunt resonators are connected in parallel.

3. The filter of claim 1, wherein the inductor unit comprises at least one inductor disposed in a configuration of three nodes connected in a Y-connection form between both ends of at least one of the set of series resonators and the ground, and the set of shunt resonators and the ground.

4. The filter of claim 3, wherein the inductor unit comprises two inductors disposed at different nodes among the three nodes.

5. The filter of claim 4, wherein the two inductors are coupled to each other, and a mutual inductance of the two inductors is formed in the remaining nodes of the three nodes.

6. The filter of claim 1, wherein a connection node of the at least two inductors is connected to a second end of the set of series resonators or the set of shunt resonators.

7. The filter of claim 6, wherein the at least two inductors are coupled to each other, and mutual inductance of the at least two inductors is formed between the connection node of the at least two inductors and the second end of the set of series resonators.

8. The filter of claim 1, wherein the impedance unit comprises a first capacitor disposed between the inductor unit and the ground.

9. The filter of claim 8, wherein the impedance unit further comprises a first inductor connected in parallel to the first capacitor.

10. The filter of claim 9, wherein the impedance unit further comprises a second capacitor and a second inductor, connected to each other in series, and the second capacitor and the second inductor are connected in parallel to the first capacitor and the first inductor, connected in parallel.

11. The filter of claim 1, wherein the correction unit further comprises a correction resonator connected in parallel to the impedance unit, and the correction resonator has a same frequency characteristic as one of the series resonators and the shunt resonators.

12. The filter of claim 1, wherein the set of series resonators corresponds to one or more than one series resonator, and the set of shunt resonators corresponds to one or more than one shunt resonators.

13. A filter comprising:
    a series resonator disposed between a signal input terminal and a signal output terminal;
    a shunt resonator disposed between one end of the series resonator and a ground; and
    a correction unit comprising
        a series correction unit comprising at least two inductors connected in series and mutually coupled between both ends of the series resonator, and a capacitor disposed between a connection node of the at least two inductors and a ground, and
        a shunt correction unit comprising at least two inductors connected in series and mutually coupled between both ends of the shunt resonator, and a capacitor disposed between a connection node of the at least two inductors and the ground.

14. A filter comprising:
    a series resonator disposed between a signal input terminal and a signal output terminal;
    a shunt resonator disposed between one end of the series resonator and a ground; and
    a correction unit comprising
        a series correction unit comprising a capacitor connected to a ground and at least two series-connected inductors mutually coupled between one end of the series resonator and the capacitor, and
        a shunt correction unit comprising at least two series-connected inductors mutually coupled between both ends of the shunt resonator, and a capacitor disposed between a connection node of the at least two inductors and the ground.

* * * * *